United States Patent
Oda

(10) Patent No.: US 9,006,815 B2
(45) Date of Patent: Apr. 14, 2015

(54) NONVOLATILE SEMICONDUCTOR MEMORY DEVICE AND METHOD FOR MANUFACTURING THE SAME

(75) Inventor: Tatsuhiro Oda, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 271 days.

(21) Appl. No.: 13/351,424

(22) Filed: Jan. 17, 2012

(65) Prior Publication Data

US 2012/0217568 A1 Aug. 30, 2012

(30) Foreign Application Priority Data

Feb. 25, 2011 (JP) ................................. 2011-039282

(51) Int. Cl.
*H01L 29/788* (2006.01)
*H01L 21/3205* (2006.01)
*H01L 21/4763* (2006.01)
*H01L 21/28* (2006.01)
*H01L 21/764* (2006.01)
*H01L 27/115* (2006.01)
*H01L 29/423* (2006.01)

(52) U.S. Cl.
CPC ...... *H01L 29/7881* (2013.01); *H01L 21/28273* (2013.01); *H01L 21/764* (2013.01); *H01L 27/11521* (2013.01); *H01L 29/42324* (2013.01)

(58) Field of Classification Search
USPC .......................................... 257/321; 438/587
See application file for complete search history.

(56) References Cited

U.S. PATENT DOCUMENTS

| | | | | |
|---|---|---|---|---|
| 2003/0151069 | A1* | 8/2003 | Sugimae et al. | 257/200 |
| 2007/0096202 | A1* | 5/2007 | Kang et al. | 257/324 |
| 2007/0257305 | A1* | 11/2007 | Sasago et al. | 257/316 |
| 2008/0057666 | A1 | 3/2008 | Kim | |
| 2008/0266940 | A1* | 10/2008 | Lai et al. | 365/163 |
| 2009/0042383 | A1* | 2/2009 | Kim et al. | 438/619 |
| 2009/0127538 | A1* | 5/2009 | Ryoo et al. | 257/5 |
| 2009/0191687 | A1* | 7/2009 | Hong et al. | 438/423 |
| 2009/0253255 | A1* | 10/2009 | Kim et al. | 438/585 |
| 2010/0221904 | A1* | 9/2010 | Brazzelli et al. | 438/586 |

FOREIGN PATENT DOCUMENTS

| | | |
|---|---|---|
| CN | 101022151 A | 8/2007 |
| JP | 2004-349549 A | 12/2004 |
| JP | 2006-302950 | 11/2006 |
| JP | 2007-501531 | 1/2007 |

(Continued)

OTHER PUBLICATIONS

Office Action issued Jan. 16, 2013 in Japanese Application No. 2011-039282 (With English Translation).

(Continued)

*Primary Examiner* — Matthew Landau
*Assistant Examiner* — Igwe U Anya
(74) *Attorney, Agent, or Firm* — Oblon, McClelland, Maier & Neustadt, L.L.P.

(57) ABSTRACT

According to one embodiment, a nonvolatile semiconductor memory device includes a silicon-containing substrate, a plurality of memory cells, and an insulating film. The substrate includes silicon. The plurality of memory cells is provided on the substrate with a spacing therebetween. The insulating film is provided on a sidewall of the memory cell. The insulating film includes a protrusion protruding toward an adjacent one of the memory cells above a void portion is provided between the memory cells.

18 Claims, 3 Drawing Sheets

(56) References Cited

FOREIGN PATENT DOCUMENTS

| | | |
|---|---|---|
| JP | 2008-66689 A | 3/2008 |
| JP | 2010-80853 | 4/2010 |
| JP | 2010-080853 | 4/2010 |
| KR | 10-2008-0022380 A | 3/2008 |

OTHER PUBLICATIONS

Office Action issued Feb. 18, 2013, in Korean Patent Application No. 10-2012-18394 with English translation.

Japanese Office Action Issued Jun. 5, 2013 in Patent Application No. 2011-039282 (with English translation).

Office Action issued Sep. 26, 2013 in Korean Patent Application No. 10-2012-0018394 (with English language translation).

Combined Office Action and Search Report issued Mar. 27, 2014 in Chinese Patent Application No. 201210044389.0 (with English translation).

Chinese Office Action issued Oct. 29, 2014, in China Patent Application No. 201210044389.0 (with English translation ).

* cited by examiner

NONVOLATILE SEMICONDUCTOR MEMORY DEVICE AND METHOD FOR MANUFACTURING THE SAME

CROSS-REFERENCE TO RELATED APPLICATIONS

This application is based upon and claims the benefit of priority from the prior Japanese Patent Application No. 2011-039282, filed on Feb. 25, 2011; the entire contents of which are incorporated herein by reference.

FIELD

Embodiments described herein relate generally to a nonvolatile semiconductor memory device and method for manufacturing the same.

BACKGROUND

The memory cell provided in a nonvolatile semiconductor memory device such as a NAND flash memory has a stacked gate structure in which a floating gate and a control gate are stacked via an intergate insulating film.

Here, with the progress of miniaturization, the dimension between the adjacent floating gates is reduced. The parasitic capacitance occurring in this portion has a non-negligible influence on the operating characteristics of the nonvolatile semiconductor memory device.

In this context, a nonvolatile semiconductor memory device has been proposed in which a void portion is provided between the adjacent memory cells to reduce the parasitic capacitance occurring between the memory cells.

However, in the step of forming an insulating film above the control gate, penetration of insulator into the void portion cannot be suppressed.

This results in increasing the parasitic capacitance occurring between the memory cells, and may hamper the improvement in the operating characteristics of the nonvolatile semiconductor memory device.

Furthermore, the amount of insulator penetrating into the void portion is changed under the influence of variations in the shape of the memory cell and the dimension between the memory cells, and variations in the process for forming the insulating film. Hence, variations occur in the proportion occupied by the void portion between the memory cells. This may result in unstable operating characteristics of the nonvolatile semiconductor memory device.

DETAILED DESCRIPTION

Figure 1:
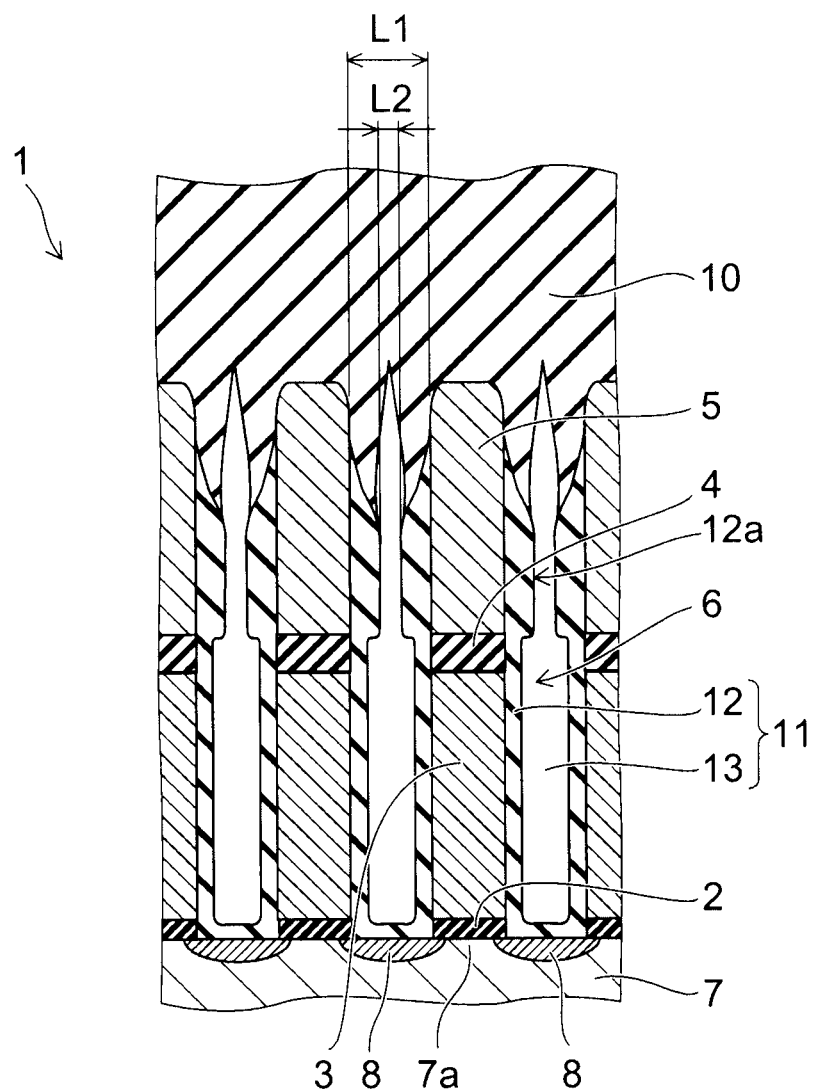
FIG. 1 is a schematic partial sectional view illustrating a nonvolatile semiconductor memory device according to a first embodiment.

In general, according to one embodiment, a nonvolatile semiconductor memory device includes a silicon-containing substrate, a plurality of memory cells, and an insulating film. The substrate includes silicon. The plurality of memory cells is provided on the substrate with a spacing therebetween. The insulating film is provided on a sidewall of the memory cell. The insulating film includes a protrusion protruding toward an adjacent one of the memory cells above a void portion is provided between the memory cells.

Embodiments will now be illustrated with reference to the drawings. In the drawings, similar components are labeled with like reference numerals, and the detailed description thereof is omitted appropriately.

[First Embodiment]

FIG. 1 is a schematic partial sectional view illustrating a nonvolatile semiconductor memory device according to a first embodiment.

Here, FIG. 1 primarily shows the portion of memory cells 6, and omits known word lines, bit lines, contacts, device isolation insulating films, peripheral circuit sections and the like provided in the nonvolatile semiconductor memory device 1.

Furthermore, FIG. 1 shows a cross section in the bit line direction (channel length direction).

As shown in FIG. 1, a plurality of memory cells 6 are provided on a substrate 7 with a spacing therebetween. The memory cell 6 includes a tunnel insulating film 2, a floating gate 3, an intergate insulating film 4, and a control gate 5 stacked in this order. The memory cell 6 is formed in an upper portion of the substrate 7 containing silicon. The memory cell 6 is provided on an active area (device formation region, or active region) 7a surrounded with a device isolation insulating film, not shown. Here, the device isolation insulating film, not shown, is formed by embedding an insulator such as silicon oxide in a trench formed in the substrate 7.

The tunnel insulating film 2 is provided on the substrate 7. In this case, the tunnel insulating film 2 is provided on the active area 7a. The tunnel insulating film 2 can be e.g. a silicon oxide film or silicon oxynitride film having a thickness of approximately 3-15 nm.

The floating gate 3 is provided on the tunnel insulating film 2. The floating gate 3 can be e.g. a polysilicon film having a thickness of approximately 10-500 nm. In this case, to provide conductivity, the floating gate 3 can be doped with e.g. phosphorus or arsenic to a concentration of approximately $10^{18}$-$10^{21}$ atoms/cm$^3$.

The intergate insulating film 4 is provided on the floating gate 3. The intergate insulating film 4 can be e.g. an insulating film having a thickness of approximately 5-30 nm. In this case, the intergate insulating film 4 can be e.g. a silicon oxide film or silicon oxynitride film. Alternatively, the intergate insulating film 4 can be e.g. a stacked film of silicon oxide film/silicon nitride film/silicon oxide film (ONO film).

The control gate 5 is provided on the intergate insulating film 4. The control gate 5 can be e.g. a polysilicon film having a thickness of approximately 10-500 nm. In this case, to provide conductivity, the control gate 5 can be doped with e.g. phosphorus, arsenic, or boron to a concentration of approximately $10^{18}$-$10^{21}$ atoms/cm$^3$.

Alternatively, a metal film of e.g. W, Ni, Mo, Ti, or Co can be formed on the formed polysilicon film and then turned into a silicide film by heat treatment. Thus, the control gate 5 can be configured to have a stacked structure in which a silicide film and a polysilicon film are stacked.

Alternatively, the control gate 5 can be configured to have a stacked structure in which a metal film and a polysilicon film are stacked. Alternatively, the control gate 5 can be configured to have a stacked structure in which a metal film, a silicide film, and a polysilicon film are stacked.

On both sides of the tunnel insulating film 2, a source/drain region 8 made of e.g. an n-type diffusion layer is provided. The source/drain region 8 is shared by the adjacent memory cells. The region below the tunnel insulating film 2 between the source/drain regions 8 constitutes a channel region.

An insulating film 10 is provided above the memory cell 6.

The insulating film 10 is provided so as to primarily cover the upper surface of the control gate 5. The insulating film 10 can be e.g. a silicon oxide film or silicon oxynitride film.

An insulating portion 11 is provided between the adjacent memory cells 6.

The insulating portion 11 includes an insulating film 12 and a void portion (air gap) 13.

The insulating film 12 is formed so as to cover the sidewall of the memory cell 6 and the surface of the substrate 7 between the memory cells 6. The insulating film 12 is provided to protect the memory cell 6 to improve the reliability. The insulating film 12 can be e.g. a silicon oxide film or silicon oxynitride film. In this case, the insulating film 12 can be made of the same material as the insulating film 10, or a different material from that of the insulating film 10. In the insulating film 12, the thickness of at least the portion formed on the sidewall of the floating gate 3 is made nearly constant to form a void portion 13 at least between the adjacent floating gates 3.

The void portion 13 is a region devoid of filling such as an insulating film. Here, the void portion 13 may include a gas such as air, or may be a vacuum (a space with a pressure lower than atmospheric pressure).

The void portion 13 thus provided can reduce the parasitic capacitance occurring between the adjacent floating gates 3. Then, the voltage applied to the tunnel insulating film 2 can be increased. Thus, the writing speed of data can be made faster.

The void portion 13 only needs to be provided at the position facing at least the floating gate 3. However, it is also possible to provide the void portion 13 at the position facing the tunnel insulating film 2, the intergate insulating film 4, and the control gate 5.

Here, when the insulating film 10 is formed above the control gate 5, if the insulator penetrates also into the void portion 13, the reduction of parasitic capacitance may be failed.

Furthermore, the amount of insulator penetrating into the void portion 13 is changed under the influence of variations in the shape of the memory cell 6 and the dimension between the memory cells 6, and variations in the process for forming the insulating film 10. Hence, variations occur in the proportion occupied by the void portion 13 between the memory cells 6. This may result in unstable operating characteristics of the nonvolatile semiconductor memory device 1.

Thus, in the nonvolatile semiconductor memory device 1, the insulating film 12 is configured to include a protrusion 12a protruding toward the adjacent memory cell 6 above the void portion 13 formed between the memory cells 6.

That is, the insulating film 12 is provided with a protrusion 12a so as to narrow the gap formed above the void portion 13.

The protrusion 12a thus provided in the insulating film 12 can suppress penetration of insulator into the void portion 13 when the insulating film 10 is formed above the control gate 5.

In the example illustrated in FIG. 1, the protrusion 12a is provided above the lower surface of the control gate 5.

However, in view of reducing the parasitic capacitance occurring between the adjacent floating gates 3, the protrusion 12a only needs to be provided above the upper surface of the floating gate 3.

In the example illustrated in FIG. 1, the protrusions 12a are provided so as to face each other in the insulating films 12 formed on the sidewall of the adjacent memory cells 6.

In this case, the dimension L2 between the protrusions 12a can be made equal to or less than half the dimension L1 between the memory cells 6.

This can suppress the influence on the operating characteristics which may occur due to penetration of insulator into the void portion 13. Here, the dimension L2 can be set to the minimum dimension between the adjacent protrusions 12a.

However, the protrusion 12a only needs to be provided in at least one insulating film 12 between the adjacent memory cells 6.

That is, by providing a protrusion 12a, the dimension of the gap formed above the void portion 13 (e.g., the aforementioned dimension L2 corresponds to an example of this dimension) can be made equal to or less than half the dimension L1 between the memory cells 6.

In the foregoing, as an example, the insulating film 10 and the insulating portion 11 are illustrated separately. However, the insulating film 10 and the insulating portion 11 may be integrally provided.

In the foregoing, as an example, the protrusion 12a is provided in the insulating film 12. However, it is also possible to provide a protrusion in the insulating film 10.

That is, it is only necessary that above the void portion 13 formed between the memory cells 6, the insulating film (at least one insulating film of the insulating film 12 and the insulating film 10) formed on the sidewall of the memory cell 6 be provided with a protrusion protruding toward the adjacent memory cell 6.

According to this embodiment, the insulating film is provided with a protrusion. Hence, the shape and dimension of the void portion 13 can be stabilized. This can reduce the parasitic capacitance, and hence improve the operating characteristics. Furthermore, the operating characteristics can be stabilized.

[Second Embodiment]

FIGS. 2A to 3D are schematic process sectional views illustrating a method for manufacturing a nonvolatile semiconductor memory device according to a second embodiment.

Here, FIGS. 2A to 3D show a cross section in the bit line direction (channel length direction).

In the manufacturing of the nonvolatile semiconductor memory device 1, for instance, active areas, word lines, bit lines, device isolation insulating films, contacts, and peripheral circuit sections are also formed. However, the formation thereof can be based on known techniques.

Thus, the description thereof is omitted herein, and the formation of the memory cell 6, insulating film 10, and insulating portion 11 is primarily illustrated.

First, on a substrate 7 containing silicon and doped with desired impurity, a film constituting a tunnel insulating film 2 is formed.

The formation of the film constituting the tunnel insulating film 2 can be performed by using e.g. the thermal oxidation method.

The film constituting the tunnel insulating film 2 can be e.g. a silicon oxide film or silicon oxynitride film having a thickness of approximately 3-15 nm.

Next, a film constituting a floating gate 3 is formed on the film constituting the tunnel insulating film 2.

The formation of the film constituting the floating gate 3 can be performed by using e.g. the LPCVD (low pressure chemical vapor deposition) method.

The film constituting the floating gate 3 can be e.g. a polysilicon film having a thickness of approximately 10-500 nm.

In this case, to provide conductivity, the film constituting the floating gate 3 can be doped with e.g. phosphorus or arsenic to a concentration of approximately $10^{18}$-$10^{21}$ atoms/cm$^3$.

Next, a film constituting an intergate insulating film 4 is formed on the film constituting the floating gate 3.

The formation of the film constituting the intergate insulating film 4 can be performed by using e.g. the LPCVD method.

The film constituting the intergate insulating film 4 can be e.g. a silicon oxide film, silicon oxynitride film, or ONO film having a thickness of approximately 5-30 nm.

Next, a film constituting a control gate 5 is formed on the film constituting the intergate insulating film 4.

The formation of the film constituting the control gate 5 can be performed by using e.g. the LPCVD method.

The film constituting the control gate 5 can be e.g. a polysilicon film having a thickness of approximately 10-500 nm.

In this case, to provide conductivity, the film constituting the control gate 5 can be doped with e.g. phosphorus, arsenic, or boron to a concentration of approximately $10^{18}$-$10^{21}$ atoms/cm$^3$.

Next, on the film constituting the control gate 5, a film constituting a hard mask 14 in etching processing is formed.

The formation of the film constituting the hard mask 14 can be performed by using e.g. the CVD method.

The film constituting the hard mask 14 can be e.g. a silicon nitride film.

Subsequently, memory cells 6 are formed by using the PEP (photo-engraving process) and RIE (reactive ion etching) method.

Thus, a plurality of memory cells 6 are formed on the silicon-containing substrate 7 with a spacing therebetween.

Then, n-type impurity is implanted into both sides of the formed memory cell 6 to form source/drain regions 8.

Figure 2A:
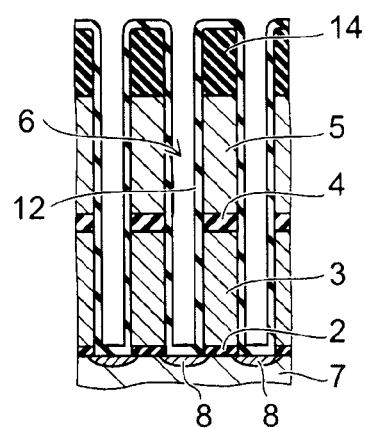
FIGS. 2A to 3D are schematic process sectional views illustrating a method for manufacturing a nonvolatile semiconductor memory device according to a second embodiment.

Next, as shown in FIG. 2A, a film constituting an insulating film 12 of an insulating portion 11 is formed.

The formation of the film constituting the insulating film 12 can be performed by using e.g. the CVD method.

The film constituting the insulating film 12 can be e.g. a silicon oxide film or silicon oxynitride film.

Figure 2B:
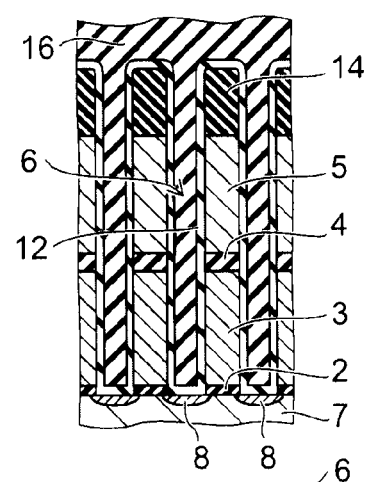

Next, as shown in FIG. 2B, a sacrificial film 16 is formed between the memory cells 6.

The formation of the sacrificial film 16 can be performed by using e.g. the LPCVD method.

The sacrificial film 16 can be e.g. a silicon nitride film.

The material of the sacrificial film 16 is not particularly limited. However, the sacrificial film 16 is made of a material different from that of the insulating film 12, and the insulating film 17 described later. In this case, to facilitate removal of the sacrificial film 16, the sacrificial film 16 is preferably made of a material having a high selection ratio with respect to the insulating film 12 and the insulating film 17.

Figure 2C:
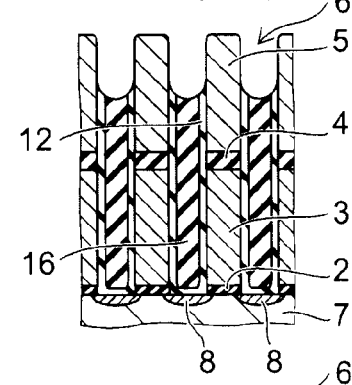

Next, as shown in FIG. 2C, the entire surface is planarized by using the CMP (chemical mechanical polishing) method.

Then, the RIE method, for instance, is used to set back the upper surface of the insulating film 12 and the sacrificial film 16 formed between the memory cells 6.

In this case, the upper surface position of the insulating film 12 constitutes the upper surface position of the insulating portion 11.

Figure 2D:
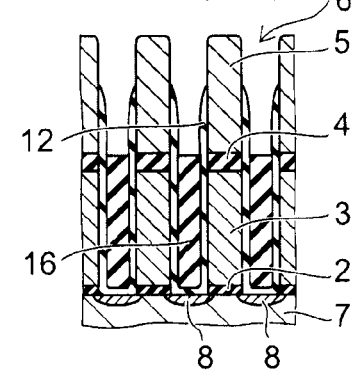

Next, as shown in FIG. 2D, the RIE method, for instance, is used to further set back the upper surface of the sacrificial film 16.

In this case, the upper surface position of the sacrificial film 16 constitutes the lower surface position of the protrusion 12a.

For instance, as shown in FIG. 2D, the upper surface of the sacrificial film 16 can be set back to the lower surface position of the control gate 5.

However, the upper surface position of the sacrificial film 16 is not limited thereto as long as being provided above the upper surface of the floating gate 3.

Figure 3A:
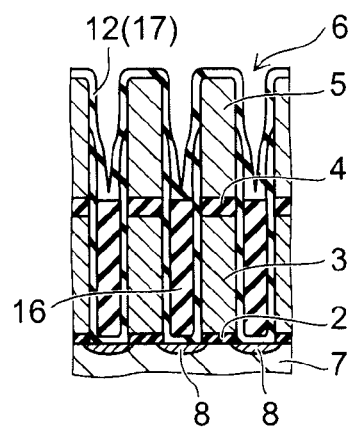

Next, as shown in FIG. 3A, an insulating film 17 is conformally formed.

That is, an insulating film is formed on the sidewall of the memory cell 6 and the upper surface of the sacrificial film 16.

For instance, the insulating film 17 can be formed by e.g. the plasma CVD method using TEOS (tetraethyl orthosilicate) and oxygen gas.

At this time, the insulating film 17 is integrated with the insulating film 12 to form the upper portion of the insulating portion 11.

Figure 3B:
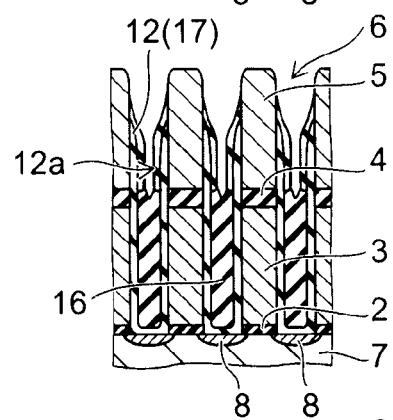

Next, as shown in FIG. 3B, the insulating film 17 formed on the upper surface of the sacrificial film 16 is selectively removed to expose the upper surface of the sacrificial film 16.

At this time, part of the insulating film 17 formed on the upper surface of the sacrificial film 16 is removed so that a protrusion 12a protruding toward the adjacent memory cell 6 is formed in the insulating film 12 integrated with the insulating film 17.

The selective removal of the insulating film 17 can be performed by using e.g. the RIE method.

Here, the position for removing part of the insulating film 17 formed on the upper surface of the sacrificial film 16 can be appropriately changed.

In this case, by removing the insulating film 17 located on the central portion of the upper surface of the sacrificial film 16, protrusions 12a facing each other can be formed. By shifting the position for removing the insulating film 17, for instance, a protrusion 12a protruding from one side can be formed.

Figure 3C:
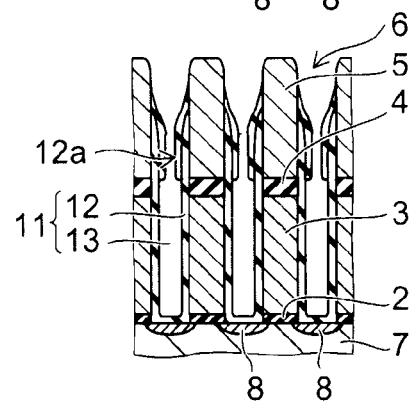

Next, as shown in FIG. 3C, the sacrificial film 16 is selectively removed.

By selectively removing the sacrificial film 16, an insulating portion 11 including the insulating film 12 and a void portion 13 is formed.

The selective removal of the sacrificial film 16 can be performed by e.g. the wet etching method.

Thus, the void portion 13 can be stably formed.

Figure 3D:
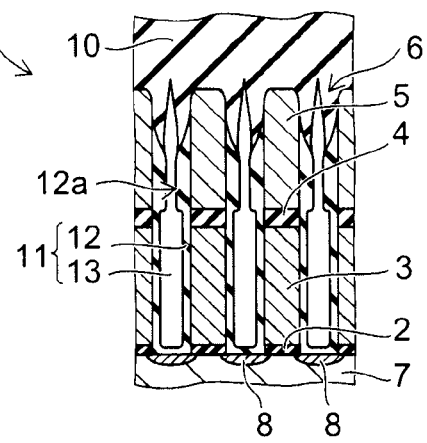

Next, as shown in FIG. 3D, an insulating film 10 is formed above the memory cell 6.

By forming the insulating film 10, the insulating film 10 and the insulating portion 11 are integrally formed.

At this time, the protrusion 12a already provided can suppress penetration of insulator into the void portion 13 when the insulating film 10 is formed.

Furthermore, by controlling the film formation condition so as to decrease the coverage, the penetration of insulator into the void portion 13 can be further suppressed.

For instance, in the plasma CVD method, the coverage can be decreased by increasing the supply amount of gas and increasing the amount of $N_2O$ relative to $SiH_4$.

According to this embodiment, the nonvolatile semiconductor memory device 1 with the protrusion 12a provided above the void portion 13 can be easily manufactured.

Furthermore, void portions 13 with uniform shape and dimension can be formed easily and stably between the memory cells 6.

The embodiments illustrated above can realize a nonvolatile semiconductor memory device capable of improving the operating characteristics and a method for manufacturing the same.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

For instance, the shape, dimension, material, arrangement, and number of the elements included in the nonvolatile semiconductor memory device 1 are not limited to those illustrated, but can be suitably modified.

The invention claimed is:

1. A nonvolatile semiconductor memory device comprising:
    a silicon-containing substrate;
    a plurality of memory cells provided on the substrate with a spacing therebetween; and
    an insulating film including a first silicon oxide film and a second silicon oxide film,
    the first silicon oxide film provided on a sidewall of the memory cell, and on a surface of the silicon-containing substrate between the memory cells,
    the second silicon oxide film provided on the first silicon oxide film above a void portion provided between the memory cells, the second silicon oxide film including a protrusion protruding toward an adjacent one of the memory cells, a material of the second silicon oxide film being same as a material of the first silicon oxide film;
    the memory cells including:
        a tunnel insulating film provided on the substrate;
        a floating gate provided on the tunnel insulating film;
        an intergate insulating film provided on the floating gate; and
        a control gate provided on the intergate insulating film;
    the protrusion is provided above an upper surface of the floating gate; and
    a height of an upper end of the protrusion is lower than a height of an upper end of the control gate.

2. The device according to claim 1, wherein dimension of a gap provided above the void portion by providing the protrusion is made equal to or less than half of dimension between the memory cells.

3. The device according to claim 1, wherein the protrusions are provided in the insulating films so as to face each other between the memory cells.

4. The device according to claim 1, wherein the protrusion is provided in at least one of the insulating films between the memory cells.

5. The device according to claim 1, wherein thickness dimension of a portion of the first silicon oxide film provided on a sidewall of the floating gate is constant.

6. The device according to claim 1, wherein the void portion is provided at a position facing at least the floating gate between the memory cells.

7. The device according to claim 1, wherein the insulating film includes at least one of silicon oxide and silicon oxynitride.

8. The device according to claim 1, wherein a height of a lower end of the protrusion is lower than a height of a lower end of the control gate.

9. A method for manufacturing a nonvolatile semiconductor memory device, comprising:

forming a film constituting a tunnel insulating film on the silicon-containing substrate;
forming a film constituting a floating gate on the film constituting the tunnel insulating film;
forming a film constituting an intergate insulating film on the film constituting the floating gate;
forming a film constituting a control gate on the film constituting the intergate insulating film;
forming an etching mask on the film constituting the control gate;
forming a plurality of memory cells on the silicon-containing substrate with a spacing therebetween by performing etching processing;
forming a first silicon oxide film on a sidewall of the memory cell, and on a surface of the silicon-containing substrate between the memory cells;
forming a sacrificial film between the memory cells, the sacrificial film being made of a material having a higher etching rate than the first silicon oxide film;
forming a second silicon oxide film on the first silicon oxide film and an upper surface of the sacrificial film, a material of the second silicon oxide film being same as a material of the first silicon oxide film;
forming a protrusion protruding toward an adjacent one of the memory cells by removing part of the second silicon oxide film formed on the upper surface of the sacrificial film, the protrusion formed by stacking the second silicon oxide film on the first silicon oxide film and a height of an upper end of the protrusion being lower than a height of an upper end of the control gate; and
removing the sacrificial film.

10. The method according to claim 9, further comprising:
    forming an insulating film above the memory cell;
    wherein the forming an insulating film above the memory cell includes controlling film formation condition so as to decrease coverage.

11. The method according to claim 10, wherein the forming an insulating film above the memory cell includes:
    in forming the insulating film above the memory cell by using a plasma CVD method, decreasing coverage by controlling at least one of supply amount of gas and composition ratio of gas.

12. The method according to claim 9, wherein the forming a sacrificial film between the memory cells includes:
    forming the sacrificial film by using a material having a higher etching rate than a material of the second silicon oxide film formed on the upper surface of the sacrificial film.

13. The method according to claim 12, wherein the material of the sacrificial film includes silicon nitride.

14. The method according to claim 9, wherein the forming a protrusion protruding toward an adjacent one of the memory cells by removing part of the second silicon oxide film formed on the upper surface of the sacrificial film includes:
    removing the second silicon oxide film located on a central portion of the upper surface of the sacrificial film.

15. The method according to claim 14, wherein the forming a protrusion protruding toward an adjacent one of the memory cells by removing part of the second silicon oxide film formed on the upper surface of the sacrificial film includes:
    forming the protrusions facing each other between the memory cells by removing the second silicon oxide film located on the central portion of the upper surface of the sacrificial film.

16. The method according to claim 9, wherein the removing the sacrificial film includes:

removing the sacrificial film by using a wet etching method.

17. The method according to claim 16, wherein the removing the sacrificial film includes:
   forming a void portion between the memory cells by removing the sacrificial film.

18. The method according to claim 9, wherein the forming the sacrificial film between the memory cells includes:
   forming the sacrificial film so that a height of an upper end of the sacrificial film is lower than a height of a lower end of the control gate.

\* \* \* \* \*